(12) United States Patent
Sinclair

(10) Patent No.: US 9,632,705 B2
(45) Date of Patent: Apr. 25, 2017

(54) SYSTEM AND METHOD FOR ADAPTIVE MEMORY LAYERS IN A MEMORY DEVICE

(71) Applicant: SanDisk Technologies Inc., Plano, TX (US)

(72) Inventor: Alan Welsh Sinclair, Falkirk (GB)

(73) Assignee: SanDisk Technologies LLC

( * ) Notice: Subject to any disclaimer, the term of this patent is extended or adjusted under 35 U.S.C. 154(b) by 88 days.

(21) Appl. No.: 14/573,959

(22) Filed: Dec. 17, 2014

(65) Prior Publication Data

US 2016/0179372 A1  Jun. 23, 2016

(51) Int. Cl.
| | |
|---|---|
| *G06F 3/06* | (2006.01) |
| *G06F 11/10* | (2006.01) |
| *G11C 11/56* | (2006.01) |
| *G11C 16/06* | (2006.01) |
| *G11C 16/34* | (2006.01) |
| *G11C 29/04* | (2006.01) |

(52) U.S. Cl.
CPC .............. *G06F 3/061* (2013.01); *G06F 3/064* (2013.01); *G06F 3/0688* (2013.01); *G06F 11/1072* (2013.01); *G11C 11/5621* (2013.01); *G11C 16/06* (2013.01); *G11C 16/349* (2013.01); *G11C 2029/0409* (2013.01); *G11C 2029/0411* (2013.01); *G11C 2211/5641* (2013.01)

(58) Field of Classification Search
None
See application file for complete search history.

(56) References Cited

U.S. PATENT DOCUMENTS

| | | | |
|---|---|---|---|
| 8,239,639 B2 | 8/2012 | Sinclair | |
| 8,261,009 B2 | 9/2012 | Freikorn | |
| 8,537,613 B2 | 9/2013 | Sinclair et al. | |
| 8,677,054 B1 | 3/2014 | Meir et al. | |
| 2008/0253217 A1* | 10/2008 | Taeuber | G11C 11/5614 |
| | | | 365/230.06 |
| 2010/0037009 A1 | 2/2010 | Yano et al. | |
| 2010/0122016 A1* | 5/2010 | Marotta | G11C 16/16 |
| | | | 711/103 |
| 2011/0252215 A1* | 10/2011 | Franceschini | G11C 11/5678 |
| | | | 711/170 |

(Continued)

OTHER PUBLICATIONS

Office Action dated May 18, 2016 for co-pending U.S. Appl. No. 14/573,949 (26 pages).

(Continued)

*Primary Examiner* — Edward Dudek, Jr.
*Assistant Examiner* — Ralph A Verderamo, III
(74) *Attorney, Agent, or Firm* — Brinks Gilson & Lione

(57) ABSTRACT

Systems and methods for implementing adaptive memory layers in a storage system are disclosed. A storage system may include a non-volatile memory with memory cells configurable to each of a plurality of bit-per-cell capacities and divided into dynamically re-sizable memory layers defined by memory cells of a particular capacity. A memory layer adjustment module associated with a controller of the storage system is configured to, upon detection of a maintenance trigger, compare the amount of valid data and overprovisioning in each layer to a target amount and to redistribute valid data and physical capacity among the memory layers according to a predetermined table or algorithm in order to optimize performance of each memory layer.

18 Claims, 12 Drawing Sheets

(56) References Cited

U.S. PATENT DOCUMENTS

| | | | |
|---|---|---|---|
| 2011/0320684 A1* | 12/2011 | Gorobets | G06F 12/0246 711/103 |
| 2012/0079167 A1 | 3/2012 | Yao | |
| 2012/0246391 A1 | 9/2012 | Meir et al. | |
| 2012/0246443 A1 | 9/2012 | Meir et al. | |
| 2012/0250433 A1* | 10/2012 | Jeon | G11C 8/18 365/193 |
| 2012/0254574 A1* | 10/2012 | Sinclair | G11C 11/5628 711/165 |
| 2012/0297122 A1 | 11/2012 | Gorobets et al. | |
| 2013/0067146 A1* | 3/2013 | Zettsu | G06F 12/02 711/103 |
| 2014/0185376 A1 | 7/2014 | Sinclair et al. | |
| 2014/0189205 A1 | 7/2014 | Sinclair et al. | |
| 2014/0189206 A1 | 7/2014 | Sinclair et al. | |
| 2014/0189207 A1 | 7/2014 | Sinclair et al. | |
| 2014/0189208 A1 | 7/2014 | Sinclair et al. | |
| 2014/0189209 A1 | 7/2014 | Sinclair et al. | |
| 2014/0189210 A1 | 7/2014 | Sinclair et al. | |
| 2014/0240335 A1 | 8/2014 | Hu et al. | |
| 2016/0179372 A1 | 6/2016 | Sinclair | |

OTHER PUBLICATIONS

Office Action in copending U.S. Appl. No. 14/573,949 mailed Dec. 29, 2016.

After Final Response and Interview Summary in copending U.S. Appl. No. 14/573,949, filed Feb. 28, 2017.

* cited by examiner

SYSTEM AND METHOD FOR ADAPTIVE MEMORY LAYERS IN A MEMORY DEVICE

BACKGROUND

Non-volatile memory systems, such as flash memory, have been widely adopted for use in consumer products. Flash memory may be found in different forms, for example in the form of a portable memory card that can be carried between host devices or as a solid state disk (SSD) embedded in a host device. Flash memory generally provides highest performance when the number of data bits per cell is lowest, such as binary flash, also known as single level cell (SLC) flash that stores one bit per cell. Flash memory that is configured to store more than one bit per cell, known as multi-level cell (MLC) flash, can store two or more bits of information per cell. While SLC flash memory is generally known for having better read and write performance (e.g., speed and endurance) than MLC flash, MLC flash provides more storage capacity and is generally less expensive to produce. The endurance and performance of MLC flash tends to decrease as the number of bits per cell of a given MLC configuration increases.

In a number of existing non-volatile memory systems, SLC and MLC are used together to try and capitalize on the advantages of each type of memory. The SLC memory may be used for its faster performance and the MLC for its greater storage density. For example, an SLC portion of a memory may be used as a buffer for data being written to the MLC memory, to support fast burst writes of data received from a host, and as the storage area of choice for frequently updated data in a memory system. Because the capacity of a block of SLC memory cells is necessarily half or less of a block of MLC memory cells, the SLC portion of a memory device is typically much smaller than the MLC portion such that the SLC portion often sets the limit for endurance for the whole memory system.

SUMMARY

Systems and methods for implementing adaptive memory layers in a storage system are disclosed. A storage system may include a non-volatile memory with memory cells configurable to each of a plurality of bit-per-cell capacities and divided into dynamically re-sizable memory layers defined by memory cells of a particular capacity. A memory layer adjustment module associated with a controller of the storage system is configured to, upon detection of a maintenance trigger, compare the amount of valid data and overprovisioning in each layer to a target amount and to redistribute valid data and physical capacity among the memory layers according to a predetermined table or algorithm in order to optimize performance of each memory layer.

According to a one aspect, a storage system is provided having a non-volatile memory and a memory layer adjustment module. The non-volatile memory includes a plurality of memory layers, where each memory layer has non-volatile memory cells currently programed at a same bit per cell capacity and each of the memory layers has non-volatile memory cells currently programmed at a different bit-per-cell capacity than each other of the plurality of memory layers. The memory layer adjustment module, which may be associated with a controller, is configured to determine a current logical fullness of the storage system and compare a logical fullness of the memory layers to a predetermined target logical fullness based on the determined logical fullness of the storage system. If a memory layer has a logical fullness greater than the target logical fullness, then the memory layer adjustment module reduces an amount of valid data in that memory layer and increases an amount of valid data in another of the plurality of memory layers. The memory layer adjustment module may accomplish this via a block reclaim process that moves the data from the memory layer with too much valid data for the current storage system fullness to another memory layer. The memory layer adjustment module may also reduce the physical capacity of the source memory layer by reassigning the block freed by the maintenance operation to a free block pool where the memory cells of the block may be re-tasked to a different bit-per-cell capacity and used in a different memory layer.

DETAILED DESCRIPTION

The present disclosure is directed to systems and methods for providing adaptive memory layers in a storage system. The system and method may utilize a memory die having a single type of MLC memory cell that can be reconfigured to store data in different bit per cell densities. For example, different ones of the same type of memory cells of the memory die may be used or re-tasked as either a one bit per cell memory cell in one portion or "layer" or a three bit per cell memory cell in another portion or layer. These bit per cell densities are also referred to herein as X1 (one bit per cell) and X3 (three bit per cell), respectively. These two particular bit-per-cell densities are provided simply by way of example and die with memory cells configurable to other bit-per-cell densities, and more layers per die than two, are also contemplated.

The adaptive layers disclosed herein may provide a way for a storage system to be specified in terms of performance (for example, write data speed, capacity and endurance) based on the fullness of the device when it includes both X1 data and X3 data. The performance when a storage system is logically 100% full can often be determined by the portion of memory blocks that are associated with the X1 memory and the portion of the remaining blocks associated with the X3 memory. The fullness of the storage system as a whole refers to the logical fullness. In other words, the ratio of all the logical addresses associated with valid data to all of the available logical addresses for the entire device regardless of which layer (X1 or X3) the data is stored in.

As set forth below, based on predetermined write amplification assumptions and a predetermined fullness requirement (including the total number of blocks associated with each layer), an algorithm or a table of fullness and block distribution at different fullness levels in the entire device may be prepared. The system and method may allow adjustment of the distribution of blocks between the layers, as well as the maximum amount of logical fullness for a particular layer that is permitted, at each of a different number of fullness levels for the entire device. A table of layer requirements, for number of blocks or fullness of the layer, may be predetermined at manufacture and stored in the storage system ahead of time. If not in table form, an algorithm that is calculated each time can be created at manufacture of the storage system so the controller in the storage system can access that algorithm to make the adjustments of amount of valid data or amount of dedicated blocks for each layer at the different stages of fullness for the entire storage system.

Figure 1A:
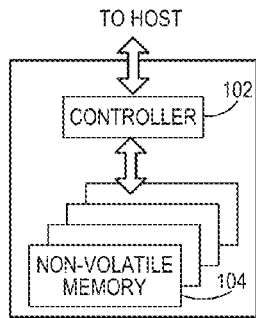
FIG. 1A is a block diagram of an example non-volatile memory system.
Figure 1B:
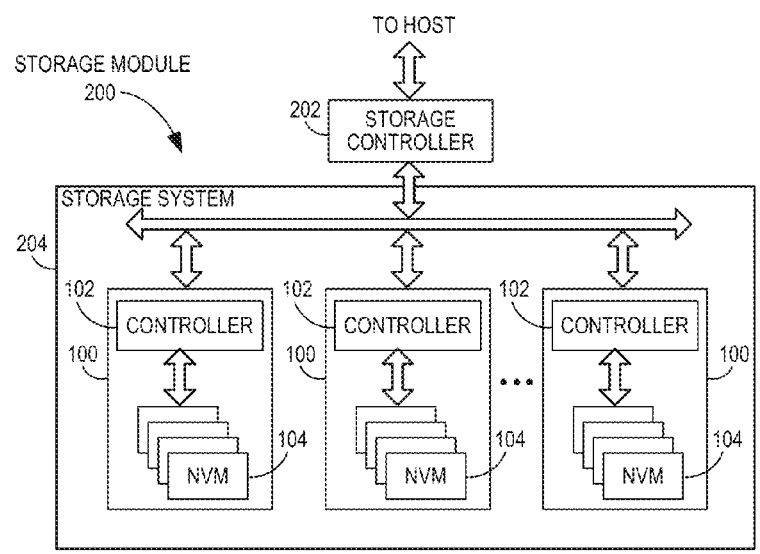
FIG. 1B is a block diagram illustrating an exemplary storage module.
Figure 1C:
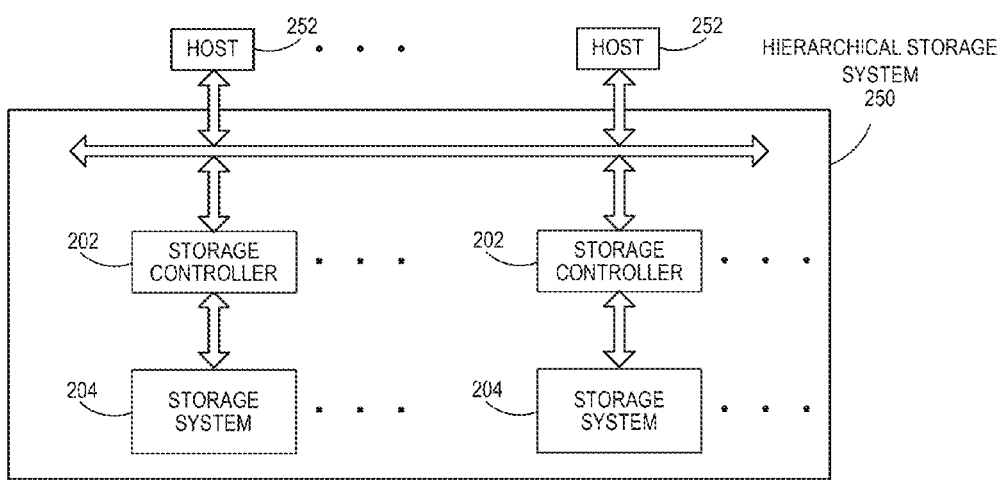
FIG. 1C is a block diagram illustrating a hierarchical storage system.

Memory systems suitable for use in implementing aspects of these embodiments are shown in FIGS. 1A-1C. FIG. 1A is a block diagram illustrating a non-volatile memory system according to an embodiment of the subject matter described herein. Referring to FIG. 1A, non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory technologies, now known or later developed. Also, the memory cells can be arranged in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be a non-volatile memory express (NVMe) or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
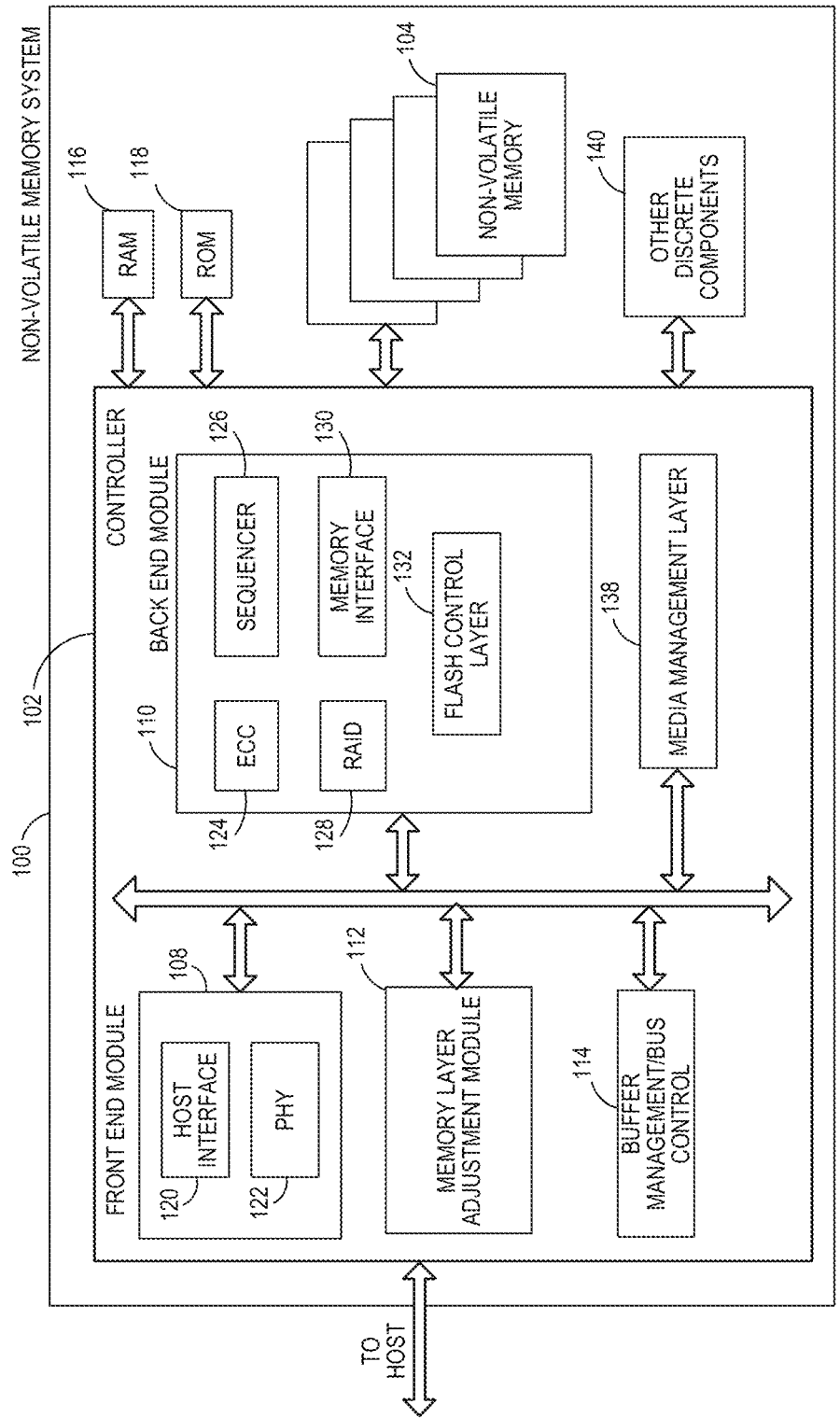
FIG. 2A is a block diagram illustrating exemplary components of the controller of the non-volatile memory system illustrated in FIG. 1A.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function or related functions, or a self-contained hardware or software component that interfaces with a larger system, for example.

Modules of the controller 102 may include a memory layer adjustment module 112. As explained in more detail below in conjunction with FIGS. 5-10, the memory layer adjustment module 112 may perform operations to control the total amount of valid data in a particular layer of a die and the total number of previously programmed blocks (full blocks or blocks with valid and obsolete data) in a layer. The memory layer adjustment module 112 may act to adjust these parameters based on overall fullness of the memory. Both of these parameters can be adjusted with block reclaim operations and dynamic allocation of blocks of cells between different bit-per-cell layers according to a fullness level of the entire device. While in some implementations the memory layer adjustment module 112 is part of the controller as described above, in other implementations, all or a portion of a memory layer adjustment module 112 may be discrete components, separate from the controller 102, that interface with the controller 102.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller 102. In yet other embodiments, portions of RAM and/or ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. In one implementation, the memory layer adjustment module 112 may be part of the media management layer 138 of the controller 102. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
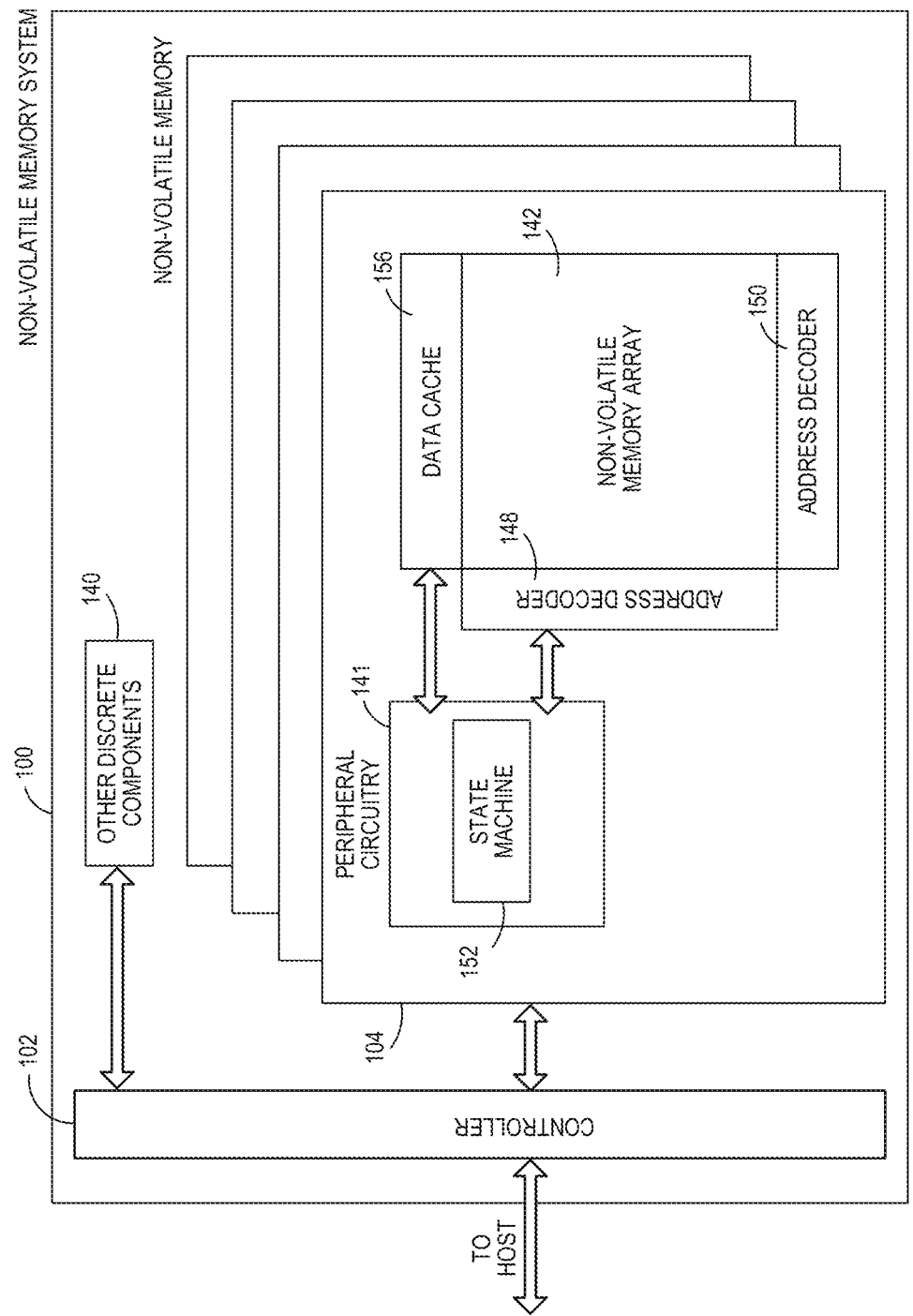
FIG. 2B is a block diagram illustrating exemplary components of the non-volatile memory of the non-volatile memory storage system illustrated in FIG. 1A.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

The controller 102 may be implemented in a single integrated circuit chip and may communicate with the different layers of memory in the non-volatile memory die 104 over one or more command channels. Controller executable code for implementing memory management instructions such as described herein may be stored in the non-volatile flash memory.

Figure 3:
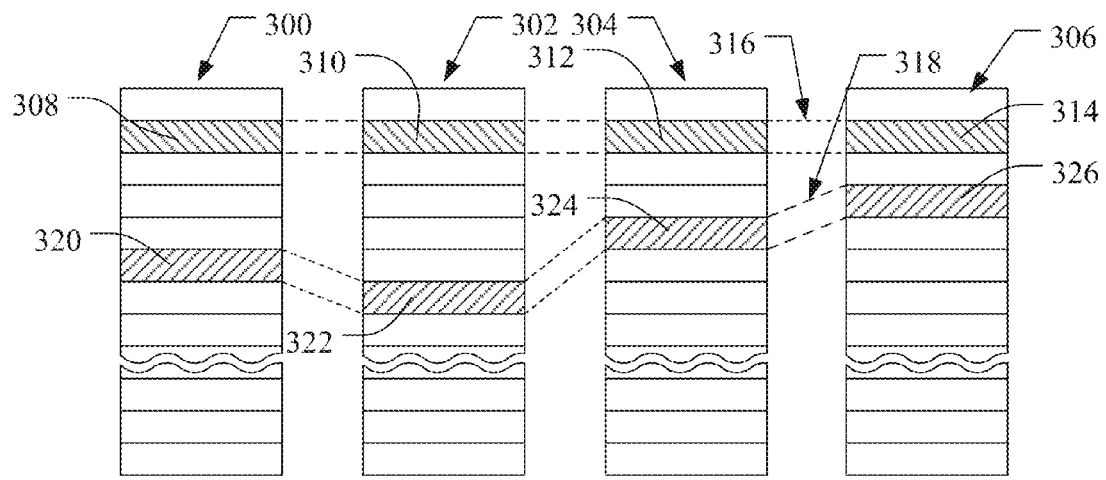
FIG. 3 illustrates an example physical memory organization of the non-volatile memory system of FIG. 1A.

The non-volatile flash memory array 142 may be arranged in blocks of memory cells. A block of memory cells is the unit of erase, i.e., the smallest number of memory cells that are physically erasable together. For increased parallelism, however, the blocks may be operated in larger metablock units. One block from each of at least two planes of memory cells may be logically linked together to form a metablock. Referring to FIG. 3, a conceptual illustration of a representative flash memory cell array is shown. Four planes or sub-arrays 300, 302, 304 and 306 of memory cells may be on a single integrated memory cell chip, on two chips (two of the planes on each chip) or on four separate chips. The specific arrangement is not important to the discussion below and other numbers of planes may exist in a system. The planes are individually divided into blocks of memory cells shown in FIG. 3 by rectangles, such as blocks 308, 310, 312 and 314, located in respective planes 300, 302, 304 and 306. There may be dozens or hundreds of blocks in each plane. Blocks may be logically linked together to form a metablock that may be erased as a single unit. For example, blocks 308, 310, 312 and 314 may form a first metablock 316. The blocks used to form a metablock need not be restricted to the same relative locations within their respective planes, as is shown in the second metablock 318 made up of blocks 320, 322, 324 and 326.

Figure 4:
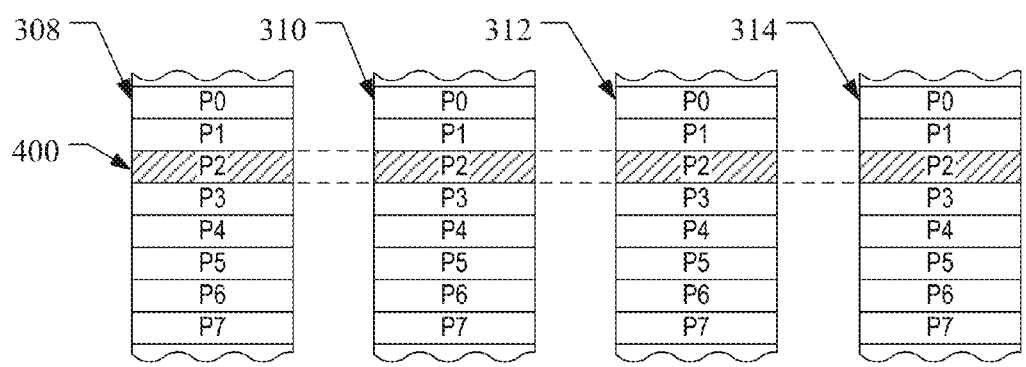
FIG. 4 shows an expanded view of a portion of the physical memory of FIG. 3.

The individual blocks are in turn divided for operational purposes into pages of memory cells, as illustrated in FIG. 4. The memory cells of each of blocks 308, 310, 312, and 314, for example, are each divided into eight pages P0-P7. Alternately, there may be 16, 32 or more pages of memory cells within each block. A page is the unit of data programming within a block, containing the minimum amount of data that are programmed at one time. The minimum unit of data that can be read at one time may be less than a page. A metapage 400 is illustrated in FIG. 4 as formed of one physical page for each of the four blocks 308, 310, 312 and 314. The metapage 400 includes the page P2 in each of the four blocks but the pages of a metapage need not necessarily have the same relative position within each of the blocks. A metapage is the maximum unit of programming. The blocks disclosed in FIGS. 3-4 are referred to herein as physical blocks because they relate to groups of physical memory cells as discussed above. As used herein, a logical block is a virtual unit of address space defined to have the same size as a physical block. Each logical block includes a range of logical block addresses (LBAs) that are associated with data received from a host. The LBAs are then mapped to one or more physical blocks in the non-volatile memory system 100 where the data is physically stored.

Figure 5A:
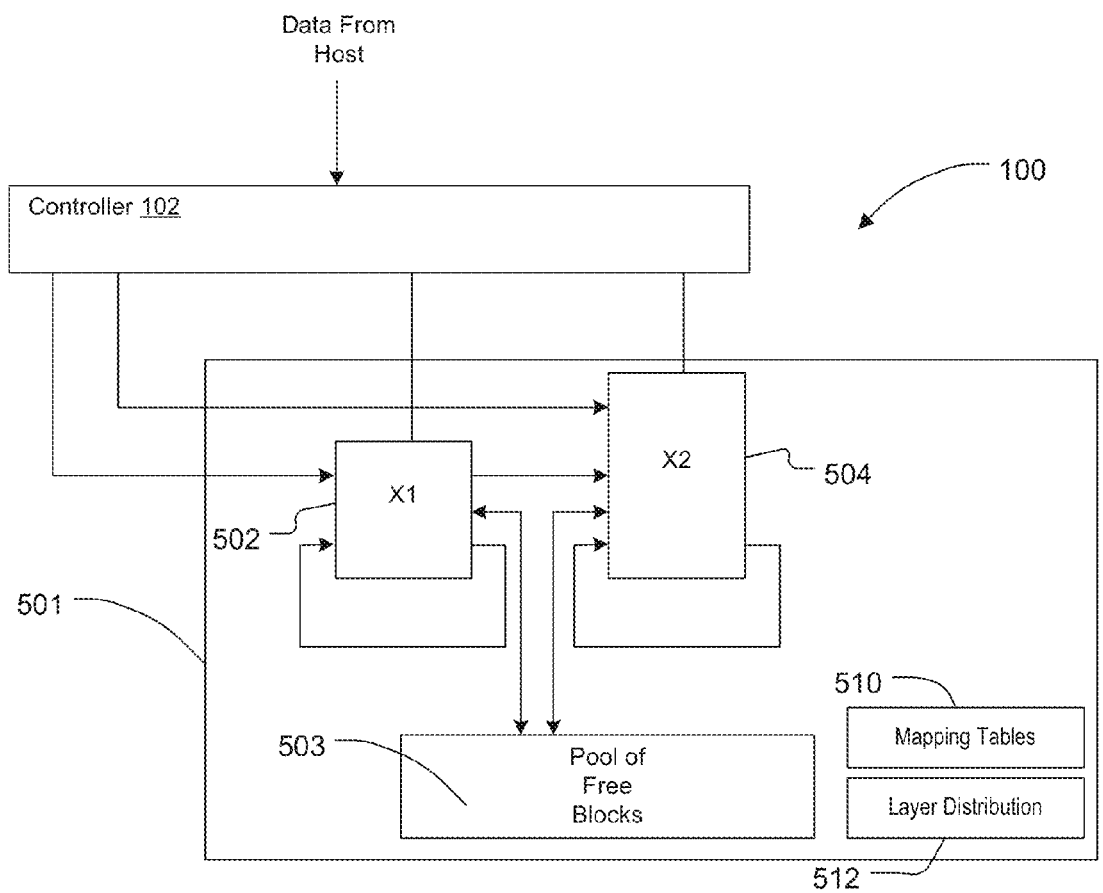
FIG. 5A illustrates an embodiment of the non-volatile memory storage system of FIG. 1A with a non-volatile memory having cells programmable into different bit-per-cell capacities.

Referring now to FIG. 5A, an embodiment of the non-volatile memory system 100 of FIG. 1 is shown having non-volatile memory 501 consisting of one or more non-volatile memory die 104, where each die, or group of die that are managed together as an independent managed set, include a common pool 503 of free blocks of non-volatile memory cells programmable into any of two or more layers 502, 504 in the non-volatile memory 501. Each layer 502, 504 includes only blocks of memory cells configured with a same bit per cell capacity and each layer having a different bit-per-cell capacity than the other layer.

Also, as explained in greater detail with respect to FIGS. 5B and 5C below, the non-volatile memory 501 of the general example of FIG. 5A may be arranged as individually managed non-volatile memory die 104, a whole number set of non-volatile die that are managed together, or a combination of the two. Each layer of a non-volatile memory die (FIG. 5B) or an independently managed set of non-volatile memory die (FIG. 5C) has memory cells of a different bit per cell capacity than each other layer in the non-volatile memory die or independently managed set.

For example, a first memory layer 502 may be configured as binary layer having blocks of non-volatile memory cells with a single bit per cell capacity, also referred to herein as an X1 layer. A second memory layer 504 may be configured with blocks of non-volatile memory cells having a two bit per cell storage capacity, or MLC flash memory, also referred to herein as an X2 layer. Other combinations of bit per cell capacity layers are also contemplated. More than two layers are also contemplated. The separate layers 502, 504 are not fixed in size and may be dynamically resized through block reclaim operations and retasking free blocks from the free block pool 503 into either of the layers at the appropriate bit per cell capacity utilized by each respective layer. Also, as used herein, the layers 502, 504 refer to groups of blocks having memory cells configured in a particular bit-per-cell capacity and does not require any particular physical arrangement of the cells or layers with respect to one another.

Figure 5B:
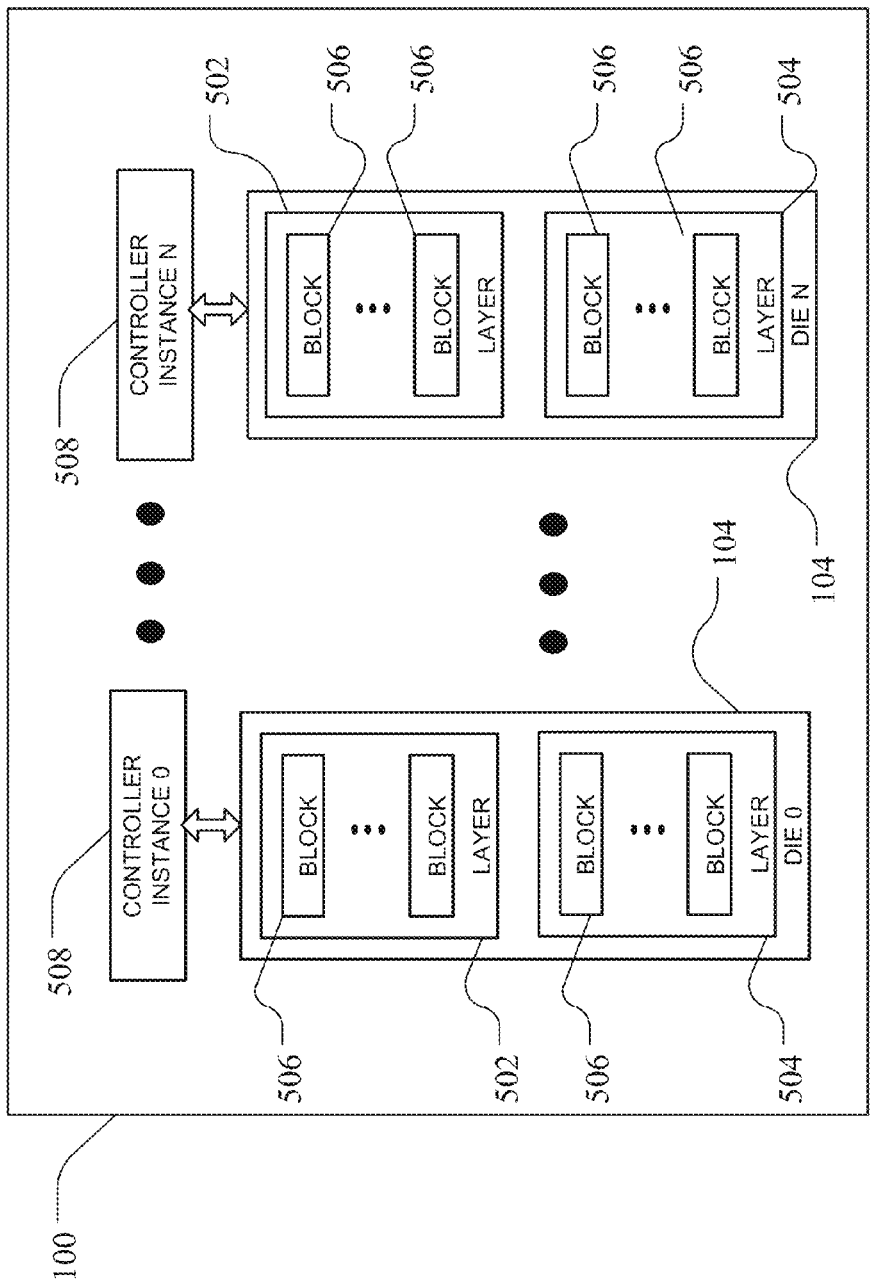
FIG. 5B illustrates an arrangement of the storage system of FIG. 5A with a non-volatile memory having two layers contained in each non-volatile memory die within the non-volatile memory, where each layer is made up cells having a particular bit-per-cell capacity and each layer has a different bit-per-cell capacity.

Referring to FIG. 5B, an example non-volatile memory 501 in the non-volatile memory system 100 is shown having each die 104 independently managed by its own controller instance 508. In this embodiment, each layer 502, 504 is defined by a blocks 506 of a particular bit per cell capacity that are within the single die 104. Each die 104 may be independently and asynchronously managed by a separate instance 508 of the controller 102 of the non-volatile memory system 100. A controller 508 instance may be a separate thread of a single controller 102, or a separate hardware of firmware implementation. Also, each non-volatile memory die in FIG. 5B handles its own multiple layers independently of the layers in each other die. As used herein, the term die refers to the set of non-volatile memory cells, and associated circuitry for managing the physical operation of those non-volatile memory cells, that are formed on a single semiconductor substrate.

Figure 5C:
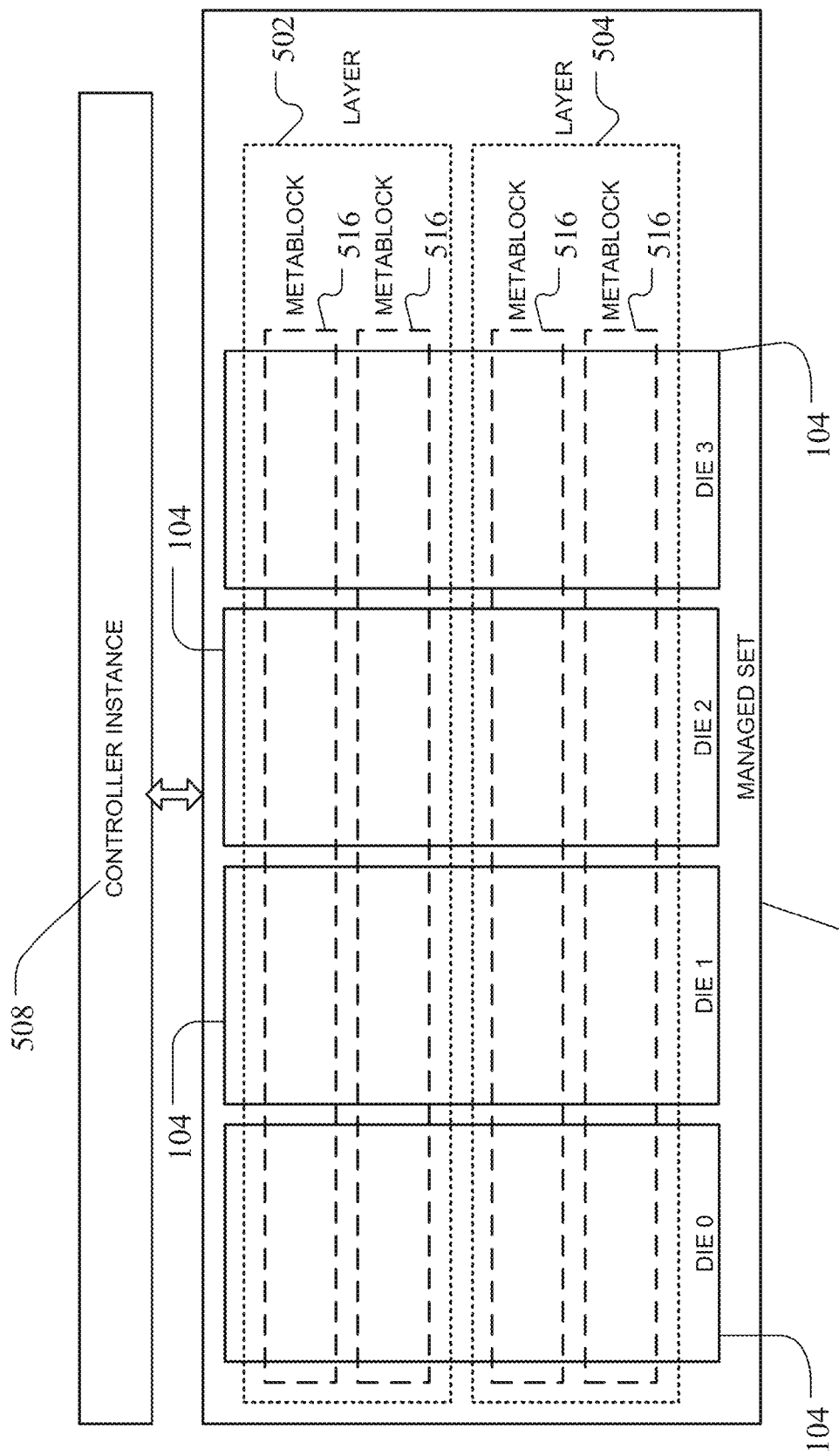
FIG. 5C is an alternative arrangement of the storage system of FIG. 5A, where the non-volatile memory of the storage system includes independently managed sets of non-volatile memory die having two layers of different bit-per-cell capacity cells that span across all the non-volatile memory die in the independently managed set.

Referring to FIG. 5C, in other embodiments the non-volatile memory is arranged in one or more independently managed sets of non-volatile memory die, where each managed set, also referred to as a metadie, is a whole number of non-volatile memory die being managed as a single unit by a separate controller instance 508. For an independently managed set 514 of non-volatile memory die, the memory layers 502, 504 may be formed across the multiple separate non-volatile memory die 104 in the managed set 514. Thus, in contrast to the layers in the individually managed die of FIG. 5B that are made up of blocks 506 completely contained within each independently managed die 104, the layers 502 and 504 in the embodiment of FIG. 5C are made up of metablocks 516 that include at least one block on each of the non-volatile memory die in the independently managed set 514 of die (metadie).

A single independently managed set of die is shown in FIG. 5C, but multiple independently managed sets could be included in a single non-volatile memory system 100. Additionally, a mix of single die with multiple layers contained within that die and independently managed sets of two or more non-volatile memory die with multiple layers across that managed set are also contemplated in a single non-volatile memory system 100. In embodiments with multiple independently managed sets of non-volatile memory die, the layers in each of the independently managed sets are handled separately from the layers in any other independently managed set. Although specific bit per cell configurations of one and two bits are illustrated in FIG. 5A, other combinations are contemplated where the first memory layer has a lower bit per cell configuration than the second flash memory layer, such as one bit-per-cell and three bit-per-cell layers. If more than two layers are present in a die or independently managed set of die, then each additional layer, in turn, may have a higher bit per cell configuration than the prior memory layer.

In one implementation, at least two layers of different bit-per-cell capacities (on a single managed die as in FIG. 5B or across all die in an independently managed set of multiple die as in FIG. 5C) are needed to implement the adaptive memory layer system and method described herein. Referring again to the generic representation in FIG. 5A of the different single die and multiple die layer structures in FIGS. 5B and 5C, one or more mapping tables 510, such as logical-to-physical mapping tables, storage address tables and so on, may be stored in non-volatile memory cells of any of the layers 502, 504 of the non-volatile memory 501. Additionally, a memory layer distribution data structure 512 (such as a table) or a memory layer distribution algorithm representing a predetermined desired physical capacity and overprovisioning for each memory layer at different storage system fullness levels, may be stored in one or more of the layers 502, 504.

It is contemplated that the mapping tables 510 and memory layer distribution data structure 512 may be specific to each independently managed die 104 or independently managed set of die 514. Additionally, the free block pool 503 is present in each die 104 that is independently managed such that any block from the free block pool may be assigned to a particular layer, reconfiguring the free block as necessary for use at the appropriate bit-per-cell capacity of the destination layer. In embodiments where one or more portions of the non-volatile memory in the non-volatile memory system 100 are organized as a set of die that are managed together as in FIG. 5C, then the free block pool 503 in each die of that managed set would contribute to a metablock, comprising at least one block in each of the die in the managed set, that would be configured to the bit-per-cell configuration of the destination layer.

The controller 102 may implement an address translation algorithm within each non-volatile memory die (independently managed as in FIG. 5B), or metadie (set of non-volatile memory die managed as a single unit as in FIG. 5C) to enhance the efficiency of data transfer and memory usage. Any of a number of known memory management techniques may be used to implement the storage system described herein. One advantage of some address translation algorithms is the ability to increase performance of storage systems in random write applications, random write applications being characterized by the need to write short bursts of data to unrelated areas in the logical block address (LBA) address space of a device, that may be experienced in solid state disk (SSD) applications in personal computers.

In one implementation of an address translation algorithm, host data is mapped from a first logical address assigned by the host (also known as a host logical block address) to blocks of contiguous logical addresses in a second logical address space (also known as a virtual logical block address). As data associated with fully programmed blocks of addresses is made obsolete, a data relocation procedure is initiated where the controller selects a previously fully programmed block in a die having the least amount of valid data, or having less than a threshold amount of valid data, and relocates the valid data in those blocks to free up those blocks for use in writing more data. The relocated data is contiguously written to a relocation block in the same die in the order it occurred in the source block needing data relocation regardless of the logical address assigned by the host. In this manner, overhead may be reduced by not purposely consolidating logical address runs assigned by the host (as in typical garbage collection).

One or more storage address tables (SAT) are used to track the mapping between the host logical address assigned by the host and the virtual logical address assigned by the storage system and subsequent changes in the mapping due to subsequent relocation. Similarly storage address tables are used to track mapping between the virtual logical address assigned by the storage system and the physical address at a die where data is actually stored.

Concurrently with accepting data from the host, the controller reclaims blocks in a maintenance operation by copying valid data from previously programmed blocks having both valid and obsolete data and then recycling the blocks from which all the valid data was copied. This block reclaiming procedure may be in the form of a standard garbage collection technique where groups of data are kept together and consolidated as new data in the same address run is received, or may be a relocation procedure where data is not consolidated into the same address groupings. As discussed in greater detail below with respect to FIGS. 6-10, the adaptive layer method takes advantage of the reclaim process, whether traditional garbage collection with consolidated address groupings or page mapped relocation of data into new address groupings, to balance the capacity, overprovisioning and fullness of each layer.

As defined herein, overprovisioning of a layer refers to the amount of physical capacity allocated to the layer in excess of the amount of physical capacity required to store data for the specified logical capacity of the layer. Overprovisioned capacity may contain data that has been made obsolete when the host updated data for the same LBA or deleted data for the LBA using a TRIM command. Increasing overprovisioned capacity increases the performance within a layer by allowing accumulation of obsolete data in blocks within the layer, and reducing the amount of valid data that has to be relocated during reclaim of a block. Although embodiments above show use of a common pool of free blocks that may be configured to any one of three different bit-per-cell densities, the following description provides an example of a two layer die for ease of illustration.

Figure 6:
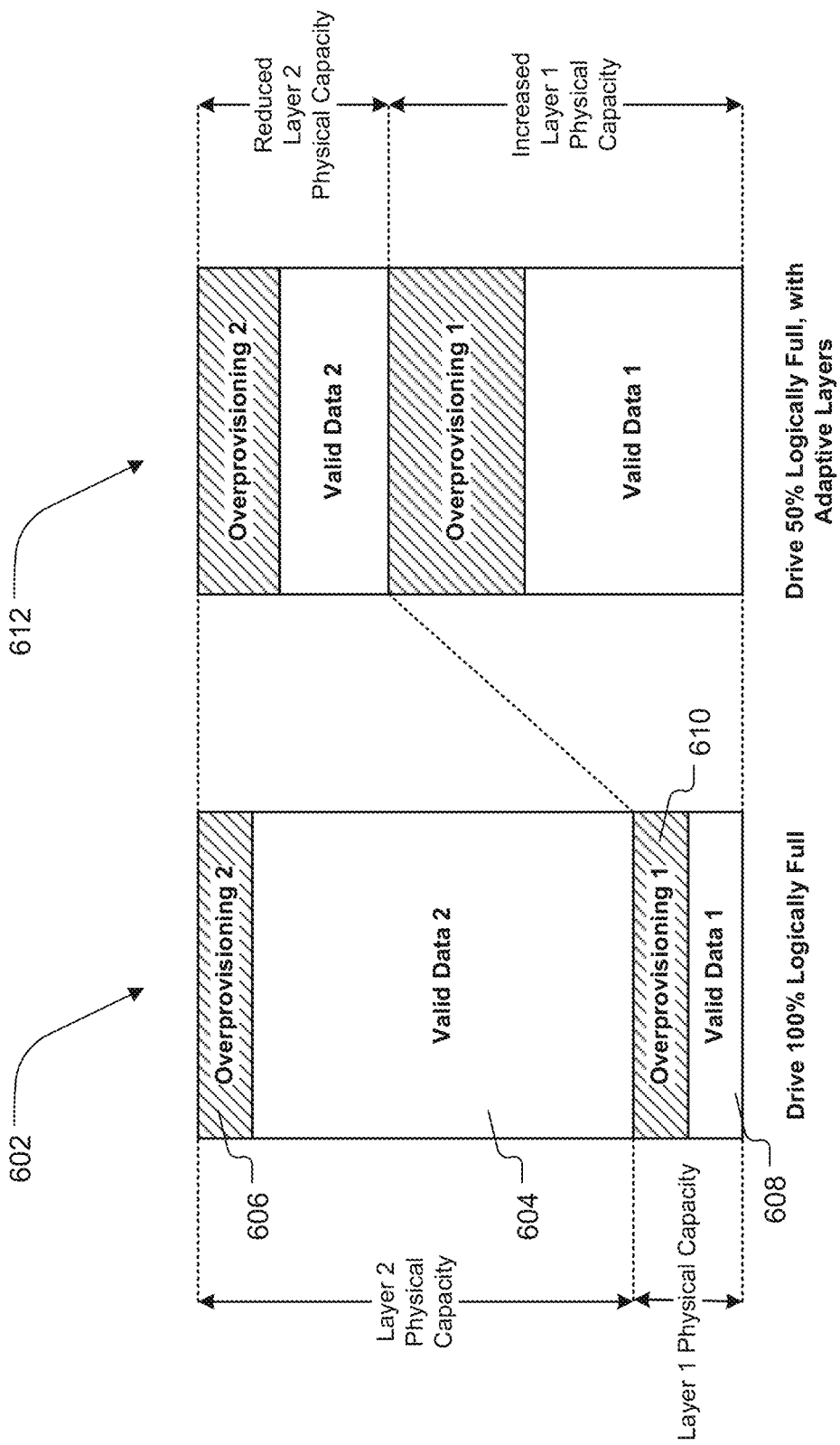
FIG. 6 illustrates a non-volatile memory die with varying physical capacities assigned to each of two layers depending on storage system logical fullness according to an embodiment of the adaptive layer technique.

Referring to FIG. 6, a hypothetical desired physical capacity distribution of valid data and overcapacity, for a die or metadie having memory cells configurable into either of two different bit-per-cell densities (Layer 1 and Layer 2), that may be obtained using the techniques described below is shown for two different levels of storage system logical fullness. Layer 2 has cells configured at a higher bit-per-cell density than the cells of Layer 1. When the die or metadie is in a 100% logical fullness state 602, the distribution of physical capacity for Layer 2 may be targeted for a particular amount of capacity assigned to valid data 604 and a remainder of that layer's capacity assigned to overprovisioning space 606. Similarly, the method and system described herein may limit a physical capacity for Layer 1 to a desired split of valid data 608 and overprovisioning space 610 for Layer 1. When the die or metadie is in a less full state, such as the illustrated hypothetical 50% logical fullness state 612, the controller may target a different distribution of physical capacity between Layer 1 and Layer 2, as well as different overprovisioning to valid data ratios in those layers. The storage system example of FIG. 6 illustrates an example trade-off between required physical capacity of the storage system at the 100% logical fullness state 602 that requires more valid data in the higher bit-per-cell density Layer 2, and the higher performance that may be obtained at the 50% logical fullness state 612 where the faster (lower bit-per-cell density) Layer 1 cells are allocated a greater physical capacity.

Figure 7:
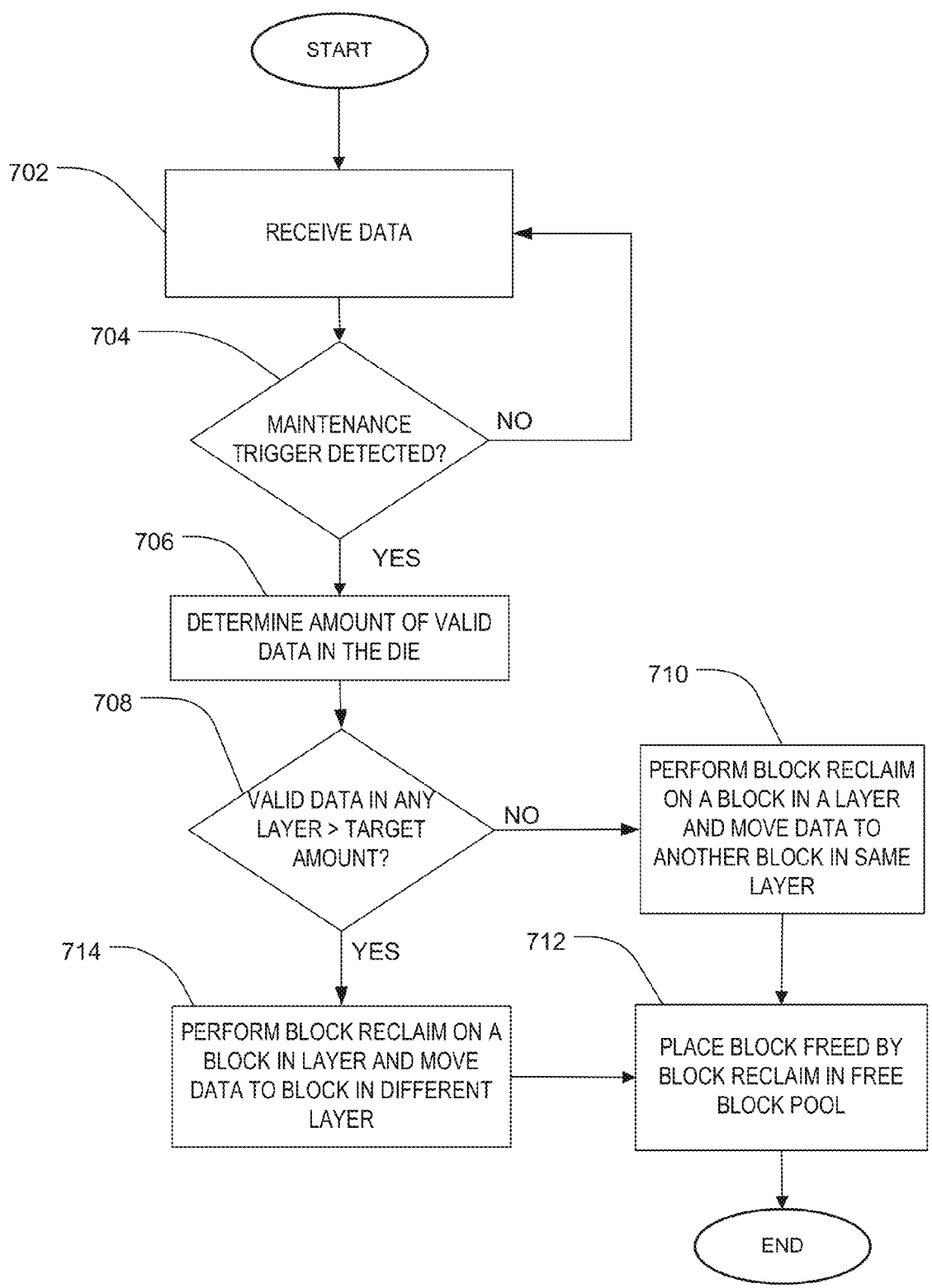
FIG. 7 is a flow chart of one implementation of a method for implementing an adaptive memory layer technique in a die having memory cells that may be programmed in any of a plurality of bit-per-cell capacities.

Referring now to the flow chart in FIG. 7, one embodiment of a method for implementing an adaptive layer process to achieve varying target physical capacity and overprovisioning settings in multiple layers is described. One or more components of the controller 102, such as the memory layer adjustment module 112, may be configured in hardware and/or software to carry out the steps set forth below. Data is received at the non-volatile memory system 100 (at 702). The received data may be data received from the host 100. In one embodiment, the controller 102 of the non-volatile memory system 100 looks to see whether a maintenance operation is needed in the storage system in order to decide whether to initiate an adaptive layer review (at 704). The controller or memory layer adjustment module 112 may identify any of a number of different maintenance triggers as part of this process. For example, the maintenance trigger may be identifying that the number of free blocks in the free block pool 503 has fallen below a predetermined minimum threshold such that a block needs to be freed from one of the layers. If the controller does not detect a maintenance operation trigger, then the storage system continues to receive and store data. If a trigger is detected, then the controller proceeds with determining how to adjust the amount of valid data and over capacity in the layers.

The controller first determines the amount of valid data contained in the various layers in the die or metadie and, based on the current fullness (e.g. total amount of valid data), checks to see if the amount of valid data in each layer exceeds a predetermined target amount desired for that memory layer at the current fullness of the storage system (at 706, 708). The total amount of fullness of the storage system may be measured in terms of the percentage of all addressable logical address space contains valid data. This percentage may be determined by the controller reviewing the logical-to-physical mapping table 510 to see how many addresses are assigned to valid data. Thus, in one implementation, the controller 102 may track the current fullness by using the one or more logical-to-physical mapping tables 510 in the storage system to identify the number of logical addresses that are assigned to valid data out of the total number of logical addresses the storage system is configured to manage. The controller may additionally or alternatively keep a running tally of the number of logical addresses for which valid data exists within the particular layer. This number is incremented when the host writes data to the layer at a logical address for which valid data does not already exist within the layer, or valid data is copied to the layer from another layer, and is decremented when the host writes data to another layer at a logical address for which valid data currently exists in the layer, valid data is copied from the layer to another layer, or the host deletes valid data within the layer using a TRIM command.

Once the total fullness of the storage system is determined, the controller may then determine the amount of valid data present in each layer. As noted above, the controller may keep an ongoing tally of the valid data being added or removed in each layer and the blocks being added or erased in each layer. It then periodically recalculates the total valid data in each layer and the total number of blocks allocated in each layer. From these values, it can also recalculate the valid data in the device, the logical fullness of the device, and the logical fullness of each layer. The amount of valid data for each layer is then compared to a target amount for that layer at the current fullness of the entire die or metadie.

Figure 8:
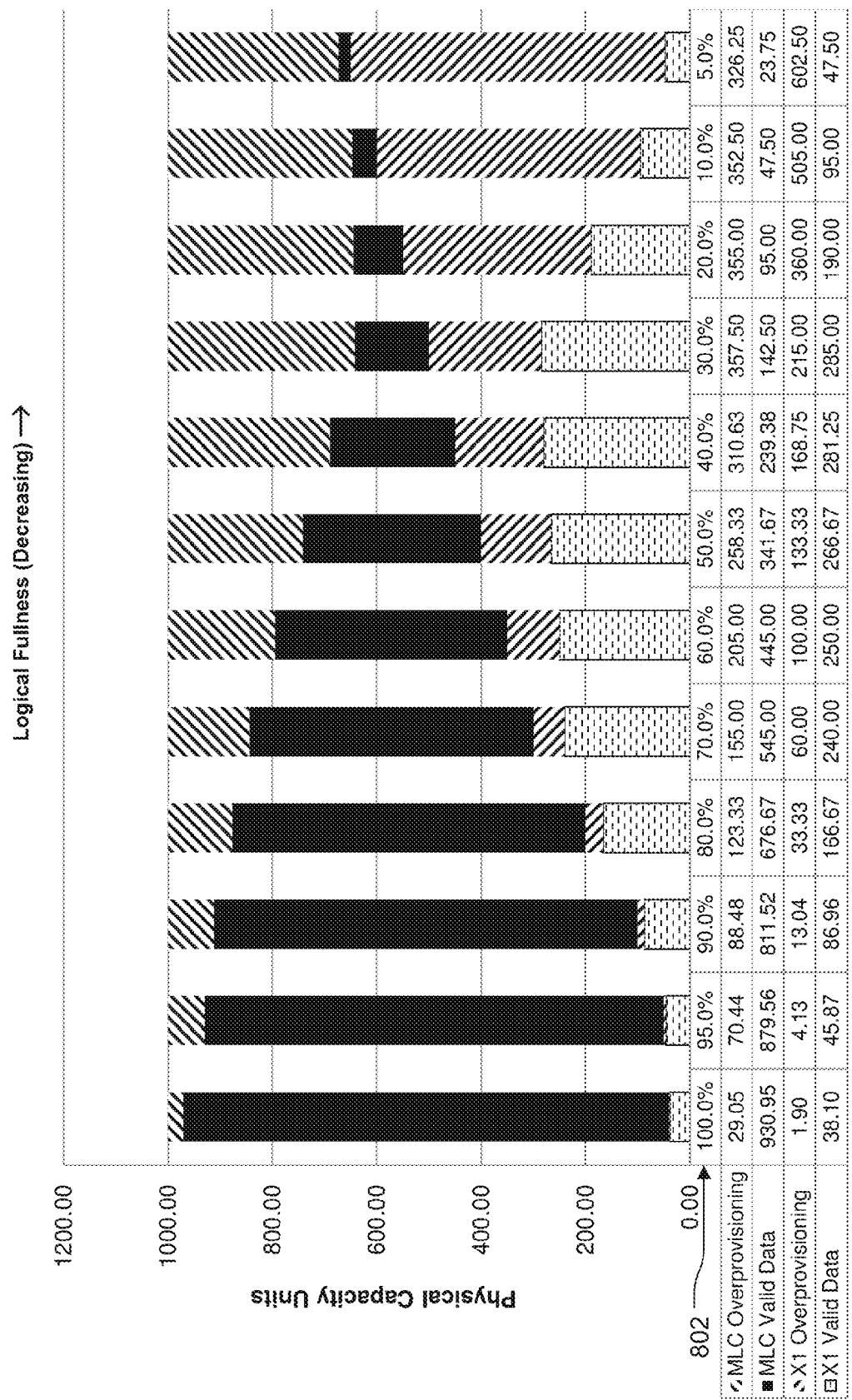
FIG. 8 is an example physical capacity distribution table for a two layer memory die corresponding to different memory die fullness levels.

The target amount of valid for a layer may be determined from a table, such as illustrated in FIG. 8, or from a predetermined algorithm. As shown in FIG. 8, the amount of valid data targeted for each of two layers in a two layer storage system at different storage system fullness levels 802 is shown. The physical capacity units may represent units in terms of bytes (Megabytes), numbers of physical blocks, or other types of storage capacity measures. Also, the number of physical capacity units in the die is actually greater than that shown due to a free block pool for the die or metadie. However, because the number of free blocks in a free block pool 503 for a die 501 is typically very low, for example 5 or 10 blocks out of thousands, they are not shown in FIG. 8 due to scale.

Because the performance and the endurance of a layer in a die or metadie is generally related to the amount of overprovisioning of the layer, the table or algorithm may be predetermined to split data between the layers in such a way as to try and obtain the greatest amount of overprovisioning for each layer, where overprovisioning refers to the amount of physical storage space above the amount of allocated logical address space for the layer. This balancing of valid data/overprovisioning in each layer may also be balanced against the overall performance of the storage system as a whole may, where the storage system performance may generally be increased by allocating a greater amount of the cells to the lower bit-per-cell capacity layer. Finally, the desire for the best performance of the storage system as a whole needs to be balanced against the requirement that the storage system be able to store a total amount of data that has been specified as the capacity of the device. In other words, the total amount of cells allocated to the less dense layer(s) may need to be adjusted downwards as the overall storage system fullness increases so that the storage system can meet its specified storage capacity. One compromise between overprovisioning, performance and capacity is represented by the predetermined table of FIG. 8 and other predetermined tables of algorithms in addition to the example of FIG. 8 are contemplated.

Referring again to FIG. 7, if the controller determines that the amount of valid data in a layer is above the target threshold for the current fullness level of the storage system, it performs a block reclaim operation on a previously programmed block in that layer (at 708, 714). The valid data from the previously programmed block is moved to a block in the other layer and the previously programed block, once the valid data has been moved, is then placed in the free block pool for configuration and use in either layer (at 712). The block selected for reclaim from the identified layer may be selected based on one or more selection criteria. In one embodiment, the block selected from the identified layer is a previously programmed block having a least amount of valid data.

Alternatively, if no layer has more valid data than the predetermined amount for that layer at the current storage system fullness, then the controller may select a block from either layer to reclaim (at 708, 710). The data moved from the selected block is moved to another block in the same layer and the freed block placed in the free block pool (at 712). Selection of a suitable block for the maintenance operation in this situation may be based on selecting a previously programmed block in the entire storage system having the least amount of valid data. In other implementations, the block selection process when no layer is above the predetermined fullness level may be based on the predetermined overprovisioning level for the layers. Thus, the controller may select a layer having greater than the predetermined overprovisioning for the current storage system fullness and then select the block in that layer having the least amount of valid data for the maintenance operation where the data is moved to another block in the same layer and the freed block added to the free block pool.

In another implementation, the adaptive layer system and method may be utilized with compressed data to further enhance performance of a storage system. Data compression may be performed on data by a controller of a non-volatile memory device to reduce the physical capacity taken up by data received from a host. Unfortunately, because some types of data are more compressible than others, it may not be generally be feasible to reduce the physical capacity of a drive from, for example, 512 Gigabytes to 256 Gigabytes on the assumption that a compression algorithm will allow a host to store 512 Gigabytes of data in a memory physically limited to 256 Gigabytes. The host will be expecting it can store a logical volume of 512 Gigabytes of actual data and if the physical compression is less than an order of 2 due to data type issues, then the storage device will not be able to handle the 512 Gigabytes of logical addresses and instead the logical capacity of such a memory device is essentially variable during operation of the memory device.

Figure 9:
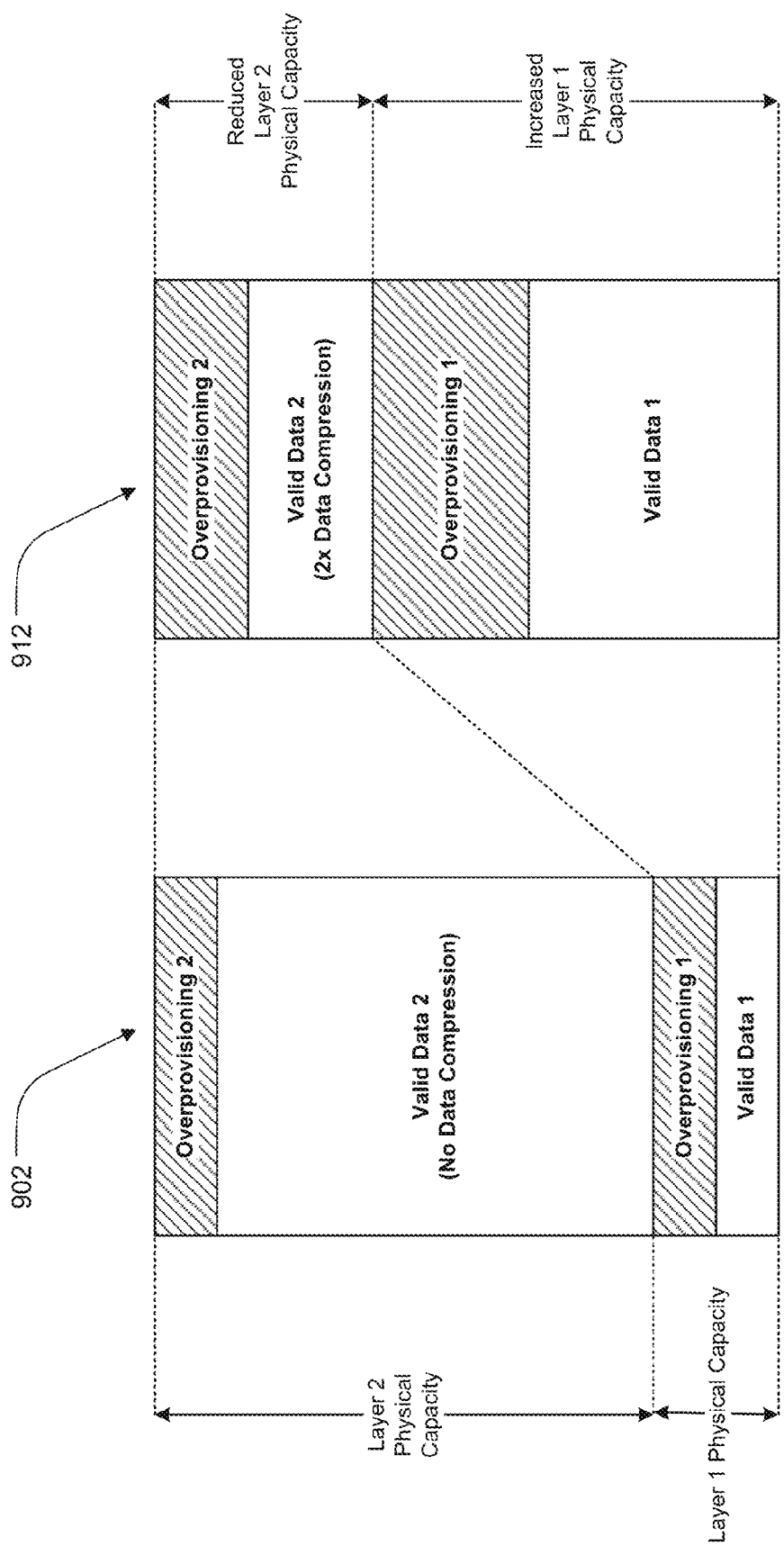
FIG. 9 illustrates a non-volatile memory die with varying physical capacities assigned to each of two layers depending on storage system logical fullness, as affected by data compression in the storage system, according to an embodiment of the adaptive layer technique.

In combination with the techniques described above with respect to FIGS. 6-8, however, compression may be incorporated to further improve the effectiveness of the adaptive layers method. An example of an effect of adding compression to the adaptive layers technique may be illustrated with reference to FIG. 9. In FIG. 9, a data distribution in a two layer storage system is illustrated in much the same way as was in FIG. 6, where the amount of physical capacity per layer, and the valid data and over provisioning amounts within each layer, for a hypothetical 100% logically full state 602 and a 50% logically full state 612 are shown. In FIG. 9, the 50% logically full state 902 is achieved with compression in the storage system. Thus, for example, the host may have sent enough data to fill 100% of the logically specified available space in the storage system as shown in state 912, but internal compression by the controller of the received data compresses the data so that, for example, only 50% of the storage system is full and the post-compression fullness may be used by the controller to select the physical capacity and valid data target thresholds for each layer as described above. In other words, the host sees the storage system as 100% full in this example, but the storage system with the internal compression may compress the data an amount that permits a higher performance (lower device fullness) operating state.

Figure 10:
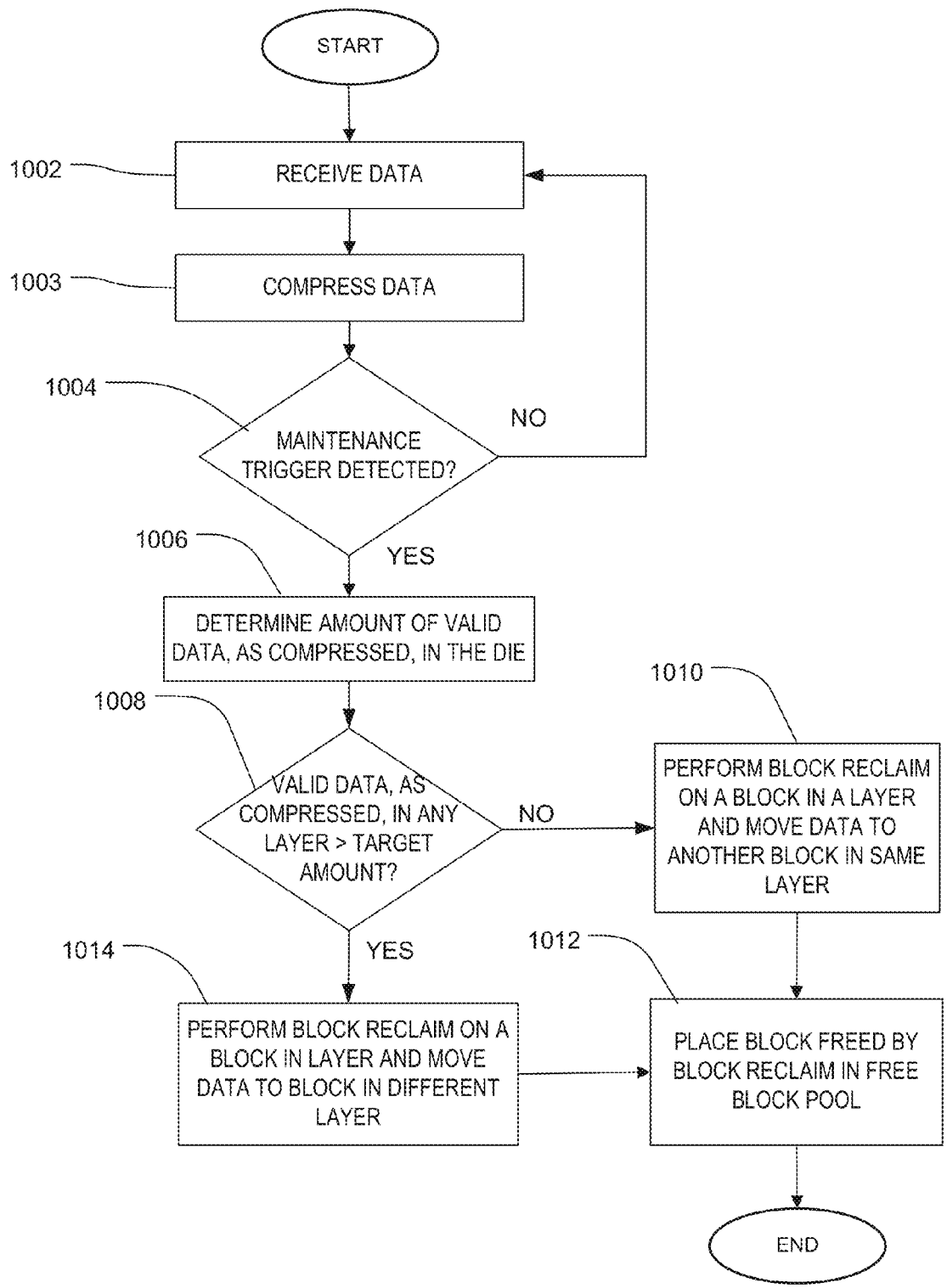
FIG. 10 is a flow chart of an alternative implementation of the method of FIG. 7 taking into account combined data compression and adaptive layer techniques for adjusting physical capacity and valid data distribution between memory layers based on storage system fullness.

Referring to FIG. 10, an implementation of the method of combined compression and adaptive layer management is illustrated. Data is received at the non-volatile memory system 100 (at 1002). The received data may be data received from the host 100. The controller 102, or components of the controller such as the memory layer adjustment module 112, then attempts to compress the received data to the extent the data is compressible, before then storing the data in blocks in one of the layers. In one embodiment, the controller may compress the received data using any one of a number of public domain compression algorithms, such as the Lempel-Ziv algorithm (at 1003). The adaptive memory layer technique, essentially as described in FIG. 7 above, is then carried out. The controller of the storage system looks to see whether a maintenance operation is needed in the storage system in order to decide whether to initiate an adaptive layer review (at 1004). The maintenance trigger may be the same as discussed with respect to FIG. 7, such as identifying that the number of free blocks in the free block pool 503 has fallen below a predetermined minimum threshold. If the controller does not detect a maintenance operation trigger, then the storage system continues to receive and store data. If a trigger is detected, then the controller proceeds with determining how to adjust the amount of valid data and overprovisioning in the layers.

The controller first determines the amount of valid data, as compressed, contained in the various layers in the die and, based on the current fullness (e.g. total amount of valid data), checks to see if the amount of valid data, as compressed, in each layer exceeds a predetermined target amount desired for that memory layer at the current fullness of the storage system (at 1006, 1008). Once the total fullness of the storage system is determined, the controller may then determine the amount of valid data, as compressed, present in each layer and compare that to a target amount for that layer at the current fullness, taking into consideration any data compression, of the entire die or metadie. The target amount may be determined from a table, such as illustrated in FIG. 8, or from a predetermined algorithm. If the controller determines that the amount of valid data, as compressed, in a layer is above the target threshold for the current fullness level of the storage system, it performs a block reclaim operation on a previously programmed block in that layer (at 1008, 1014). The valid data from the previously programmed block is moved to a block in the other layer and the previously programed block, once the valid data has been moved, is then placed in the free block pool for configuration and use in either layer (at 1012).

The block selected for reclaim from the identified layer may be selected based on one or more selection criteria such as discussed with respect to the embodiment of FIG. 7. If no layer has more valid data than the predetermined amount for that layer at the current storage system fullness, then the controller may select a block from either layer to reclaim (at 1008, 1010). The data moved from the selected block is moved to another block in the same layer and the freed block placed in the free block pool (at 1012). Selection of a suitable block for the maintenance operation in this situation may be based on the same criteria discussed with respect to FIG. 7.

The adaptive layers technique and compressed data include the ability to provide a guaranteed baseline operating point when no data compression is present, with respect to layer physical and logical capacity and physical overprovisioning, that may be adapted according to actual data compression achieved in the storage system to optimize performance and endurance. Also, endurance limitations in a storage system which may be set by a low capacity X1 layer in the baseline operating point may be reduced.

The adaptive layer management techniques set forth above have been described primarily with respect to a memory die having memory cells configurable into either one of two separate bit-per-cell density layers for clarity of description. However, die with cells reconfigurable between any of more than two different bit-per-cell layers are also contemplated. In embodiments with a die or metadie capable of switching cells between layers of more than two densities, the process is essentially the same; however selection of which layer to perform a maintenance operation on, or to which layer to move data from a block in the selected layer may have more variations. As for layer selection when a maintenance operation trigger is detected, the layer that is the most over the desired valid data capacity may be selected. If there is no layer that has more than the target amount of valid data, then the layer that is the most beyond its target overcapacity may be selected. Similarly, the destination of data from a layer having the greatest amount of valid data over the target amount may be the layer which has the least amount of valid data over its target for the particular storage system fullness. Additional variations are contemplated and the techniques may be scaled to any number of die or metadie with cells configurable into any of two or more bit-per cell densities.

A system and method for adaptive layer management of a non-volatile memory die and/or metadie have been disclosed. The parameters that the adaptive layer technique may control are the total amount of valid data in a particular layer and the total number of previously programmed blocks (full blocks or blocks with valid and obsolete data) in a layer. Both of these parameters can be adjusted with block reclaim operations and dynamic allocation of blocks of cells between different bit-per-cell layers according to a fullness level of the entire device. This may be done so that the predetermined chart (FIG. 8) or algorithm for achieving a desired compromise of capacity and performance levels in all layers is maintained to obtain a desired level of performance at different stages of fullness for the device. Regardless of whether the total amount of valid data in the layer is being looked at or the total number of preprogramed blocks currently in the layer is being looked at, these two parameters may be tied to the particular fullness level so that at each level of fullness (100%, 90%, 80%, etc.) the desired valid data limit and preprogramed block limit can be adjusted.

The total amount of valid data in a layer (for example the X1 layer) may be determined when a maintenance situation trigger occurs. For example, the maintenance operation may be triggered by the number of free blocks for the memory system dropping below a predetermined threshold (for example in a non-volatile memory die or metadie with X1 and X3 layers where the free blocks are shared between the X1 and X3 layers) which then triggers a review of the current fullness of the entire device and a comparison then of the amount of valid data in the X1 layer to the target valid data limit associated with that fullness for the device. If the current amount of valid data in the X1 layer is greater than the target amount designated for the current fullness of the entire device, then a block in the X1 layer is selected for garbage collection and all the valid data in that selected block is moved into an X3 block and the free block from the X1 layer as a result of the garbage collection or other maintenance operation is then placed into the common free block pool for both layers. If the amount of valid data in the X1 layer at the time of the maintenance operation is less than the target then the maintenance operation may be executed to move (relocate) data within the X1 layer.

It is intended that the foregoing detailed description be regarded as illustrative rather than limiting, and that it be understood that it is the following claims, including all equivalents, that are intended to define the spirit and scope of this invention.

In the above discussion, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

I claim:

1. A storage system comprising:
a nonvolatile memory having a plurality of memory cells, each of the plurality of memory cells programmable in any of a plurality of bit-per-cell capacities, the plurality of memory cells defining a plurality of memory layers, wherein each of the plurality of memory layers is defined by a portion of the plurality of memory cells currently having a same bit-per-cell capacity, and a bit-per-cell capacity of each memory layer differs from a bit-per-cell capacity of each other memory layer;
a data structure containing a predetermined target logical fullness for each of the plurality of memory layers corresponding to each of a plurality of storage system logical fullness levels; and
a controller in communication with the non-volatile memory, the controller configured to:
determine a current logical fullness of the storage system;
compare a logical fullness of one of the plurality of memory layers to a target logical fullness based on the determined logical fullness; and
in response to determining that the logical fullness of the one of the plurality of memory layers is greater than the target logical fullness:
select a block from the one of the plurality of memory layers;
copy valid data from the selected block to a different one of the plurality of memory layers; and
designate the selected block as a free block for use by any of the plurality of layers.

2. The storage system of claim 1, wherein the non-volatile memory comprises a silicon substrate and a plurality of memory cells forming a monolithic three-dimensional structure, wherein at least one portion of the memory cells is vertically disposed with respect to the silicon substrate.

3. The storage system of claim 2, wherein the controller is on a same substrate as the memory cells.

4. The storage system of claim 1, where the storage system is embedded in a host.

5. The storage system of claim 1, where the storage system is removably connectable to a host.

6. The storage system of claim 1, wherein the predetermined target fullness differs for each of the plurality of memory layers.

7. The storage system of claim 1, wherein the controller is further configured to determine whether a maintenance operation is needed for the storage system, and wherein the controller is configured to determine the current logical fullness of the storage system only in response to a determination that the maintenance operation is needed.

8. The storage system of claim 7, wherein the controller is configured to determine that the maintenance operation is needed when a number of free blocks for the storage system is below a predetermined threshold.

9. The storage system of claim 1, wherein the non-volatile memory comprises a single non-volatile memory die and each of the plurality of layers are within the single non-volatile memory die.

10. The storage system of claim 1, wherein the non-volatile memory comprises a metadie having a plurality of individual non-volatile memory die managed as a set, and wherein each of the plurality of layers spans all of the plurality of individual non-volatile memory die in the metadie.

11. The storage system method of claim 1, wherein to select the block the controller is configured to select a previously programmed block having a least amount of valid data in the one of the plurality of memory layers.

12. A storage system comprising:
- a non-volatile memory having a plurality of memory layers, each memory layer comprising non-volatile memory cells currently programed at a same bit per cell capacity, wherein each of the plurality of memory layers has non-volatile memory cells currently programmed at a different bit-per-cell capacity than each other of the plurality of memory layers;
- a memory layer distribution data structure, the memory layer distribution data structure comprising a table of predetermined target memory layer capacities corresponding to each of a plurality of storage system fullness levels; and
- memory layer adjustment means:
  - determining a current logical fullness of the storage system;
  - comparing a logical fullness of one of the plurality of memory layers to a target logical fullness in the memory layer distribution data structure based on the determined logical fullness of the storage system; and
  - adjusting a physical capacity and a logical capacity of the one of the plurality of layers when the logical fullness of the one of the plurality of layers is greater than the target logical fullness.

13. The storage system of claim 12, wherein to adjust the physical capacity in the one of the plurality of memory layers, the memory layer adjustment means is further configured to execute a maintenance operation in the one of the plurality of memory layers to reduce the physical capacity.

14. The storage system of claim 12, wherein to adjust the physical and the logical capacity the memory layer adjustment means is configured to:
- select a block from the one of the plurality of memory layers;
- copy valid data from the selected block to the another one of the plurality of memory layers; and
- identify the selected block as a free block for use by any of the plurality of layers.

15. The storage system of claim 12, wherein the memory layer adjustment means is further configured to:
- determine whether a maintenance operation is needed for the storage system; and
- determine the logical fullness of the plurality of memory layers only in response to a determination that the maintenance operation is needed.

16. The storage system of claim 15, wherein the memory layer adjustment means is further configured to determine the need for a maintenance operation in response to detecting that a number of free blocks for the storage system is below a predetermined threshold.

17. The storage system of claim 12, wherein the non-volatile memory comprises a single non-volatile memory die and each of the plurality of layers is located within the single non-volatile memory die.

18. The storage system of claim 12, wherein the non-volatile memory comprises a metadie having a plurality of individual non-volatile memory die managed as a set, and wherein each of the plurality of layers spans all of the plurality of individual non-volatile memory die in the metadie.

* * * * *